(12) United States Patent
Shiota et al.

(10) Patent No.: US 6,479,410 B2
(45) Date of Patent: *Nov. 12, 2002

(54) PROCESSING METHOD FOR OBJECT TO BE PROCESSED INCLUDING A PRE-COATING STEP TO SEAL FLUORINE

(75) Inventors: Iku Shiota, Isehara (JP); Shoichi Abe, Sagamihara (JP)

(73) Assignee: Tokyo Electron Limited, Tokyo-To (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/055,910

(22) Filed: Apr. 7, 1998

(65) Prior Publication Data

US 2002/0006724 A1 Jan. 17, 2002

(30) Foreign Application Priority Data

Apr. 9, 1997 (JP) .............................................. 9-106763

(51) Int. Cl.$^7$ .......................... H01L 21/44; H01L 21/31; H01L 21/469
(52) U.S. Cl. ........................ 438/905; 438/788; 438/685
(58) Field of Search ................................ 438/905, 788, 438/685

(56) References Cited

U.S. PATENT DOCUMENTS

| | | | | |
|---|---|---|---|---|
| 5,326,723 A | * | 7/1994 | Petro et al. | |
| 5,456,757 A | * | 10/1995 | Aruga et al. | |
| 5,620,526 A | * | 4/1997 | Watatani et al. | |
| 5,705,080 A | * | 1/1998 | Leung et al. | |
| 5,785,796 A | * | 7/1998 | Lee | |
| 5,846,883 A | * | 12/1998 | Moslehi | |

\* cited by examiner

Primary Examiner—John F. Niebling
Assistant Examiner—Ron Pompey
(74) Attorney, Agent, or Firm—Smith, Gambrell & Russell, LLP

(57) ABSTRACT

A wafer is mounted on a mounting stand 3 that is provided with an electrostatic chuck. Then an SiOF film is formed by creating a plasma of a processing gas and heating the wafer W to approximately 350° C. while the surface of the mounting stand 3 is heated to 200° C. After ten wafers W have been processed, cleaning is performed to remove a film S that has adhered to the interior of the film-formation chamber, and then a pre-coat is formed. A protective plate 5 made of aluminum nitride is placed on the mounting stand 3 during the cleaning and pre-coating steps. The protective plate 5 protects the surface of the electrostatic chuck during the cleaning and prevents the formation of a film on the mounting stand 3 during the pre-coating. In addition, since the protective plate 5 is electrostatically attracted to the mounting stand 3 and it is also strong with respect to thermal shocks, there is no need to lower the temperature of the mounting stand 3 during the cleaning, which improves throughput.

18 Claims, 7 Drawing Sheets

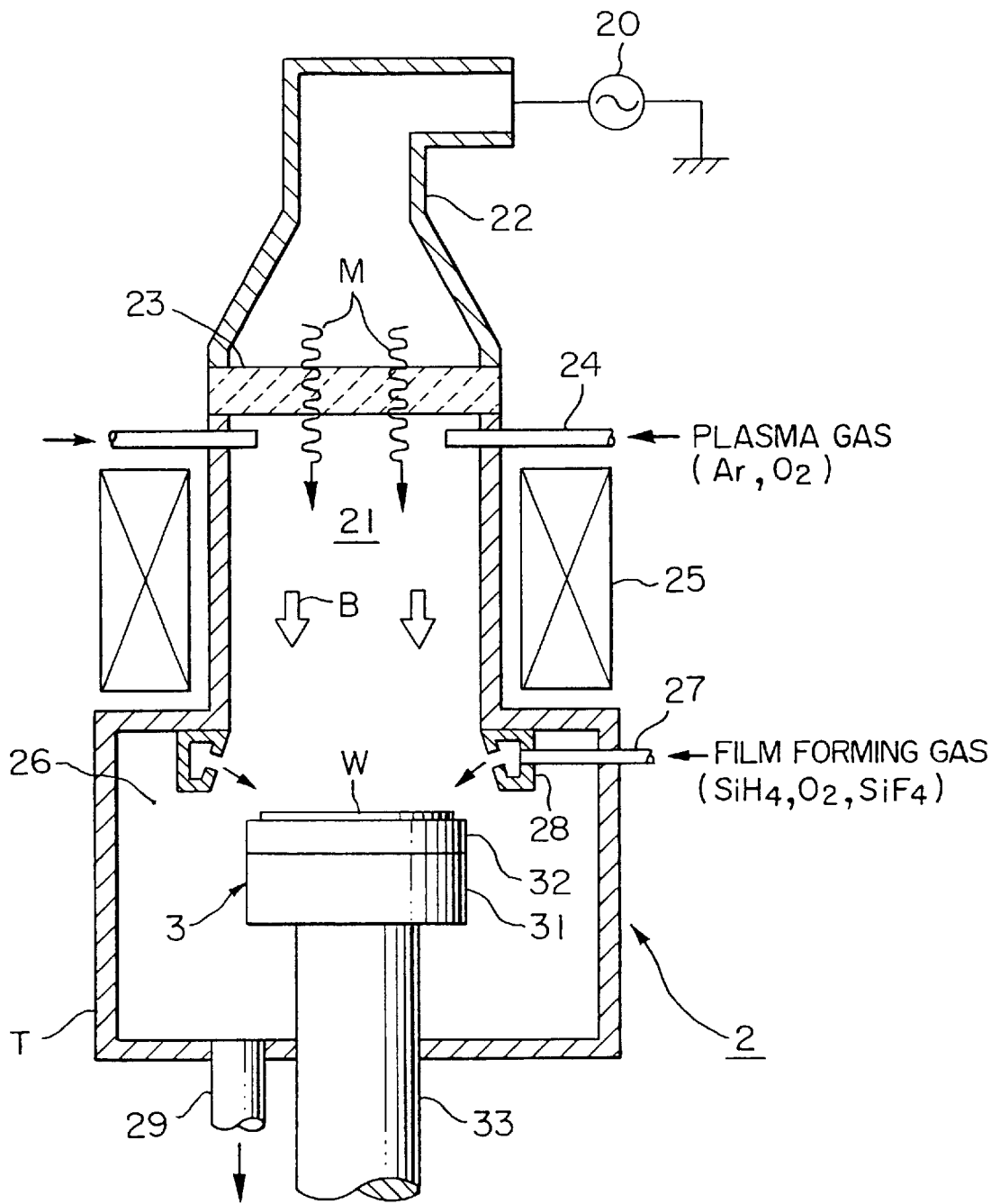
F I G. 1

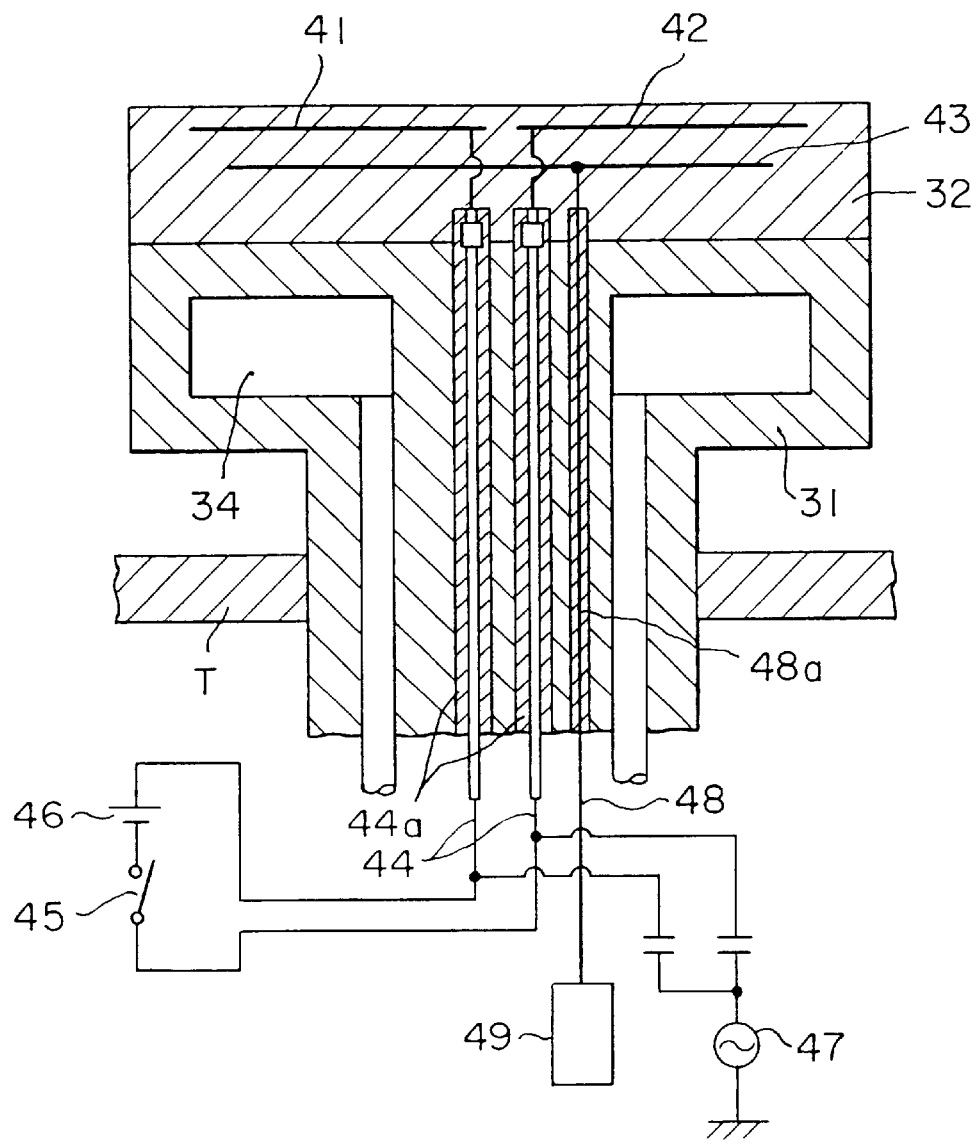
F I G. 2

PROCESSING METHOD FOR OBJECT TO BE PROCESSED INCLUDING A PRE-COATING STEP TO SEAL FLUORINE

BACKGROUND OF THE INVENTION

1. Field of the Invention

The present invention relates to a processing method for cleaning an object to be processed after it has been subjected to a film-formation process.

2. Description of Related Art

Aluminum wiring is mainly used as the wiring pattern of an integrated circuit and an $SiO_2$ or SiOF film is used as an inter-layer insulating film for insulating that wiring. These films are formed by using a plasma apparatus that performs an electron cyclotron resonance (ECR) processing, as shown in FIG. 6 by way of example.

In FIG. 6, microwaves M at, for example, 2.45 GHz are supplied into the interior of a plasma generation chamber 1A of a vacuum vessel 10, and also a magnetic field of, for example, 875 Gauss is applied thereto by an electromagnetic coil 12, so that the mutual interaction (resonance) between the microwaves and the magnetic field causes a plasma to be formed from a plasma gas such as Ar or $O_2$ and also a film-formation gas such as SiH4 which is introduced into a film-formation chamber 1B. This forms a film on a semiconductor wafer (hereinafter referred to simply as "wafer") W that is mounted on a mounting stand 13 (see FIG. 7A). This mounting stand 13 is provided with a foil electrode 15 and a resistance heater 16 for heating the wafer W to a predetermined temperature, and it is covered by an insulating layer 14 formed of a material such as a polyimide, alumina, or aluminum nitride, and is configured so that the surface thereof acts as an electrostatic chuck.

If the above film-formation step is repeated, a film S will adhere to the periphery of the mounting stand 13 and the inner walls within the film-formation chamber 1B, as shown in FIG. 6, and this film S will crack and generate particles when it reaches a certain thickness. A cleaning process to remove the adhered film S is therefore performed every time a dozen or so wafers W have been processed. The cleaning process for removing an $SiO_2$ film or the like, is done by sending a fluorine-based gas such as $CF_4$ or $NF_3$ as a cleaning gas into the film-formation chamber 1B, activating the cleaning gas by a plasma, then causing radicals to react with the adhered film to remove it (see FIG. 7C).

Unfortunately, if the mounting stand 13 is exposed to a plasma, the surface of the electrostatic chuck will be struck by the plasma and will be roughened thereby. This will change the attractive force with respect to the wafer W and the heat conduction within the surface, thus worsening the surface uniformity with which the film thickness is formed on the wafer W. In order to protect the surface of the mounting stand 13 from the plasma, it has been considered to place a dedicated protective wafer CW on the mounting stand 13 as shown in FIG. 7C, and perform the cleaning. An alumina ($Al_2O_3$) disk 17 having an aluminum (Al) layer 17a formed on the lower surface thereof is used as this protective wafer CW, and this protective wafer CW is held by the electrostatic attraction of the aluminum layer 17a onto the mounting stand 13.

The alumina that is the material of the protective wafer CW is a ceramic. So it is weak with respect to thermal shocks but the protective wafer CW is attracted onto the mounting stand 13. Therefore, even though the surface temperature is raised abruptly by the plasma, heat escapes towards the mounting stand and thus the thermal shocks can be reduced to a certain extent.

However, there is a tendency towards increasing the processing temperatures during this film-formation process, in order to improve the quality of the film formed thereby, so that the wafer W is heated to approximately 350° C. by the resistance heater 16 and the plasma during the process of forming an SiOF film. The temperature of the surface of the mounting stand 13 at this point is approximately 200° C. In this case, the electrostatic attraction ensures that the thermal shock on the alumina can be reduced to a certain extent, but, even so, the surface temperature of the mounting stand 13 has an upper limit of about 150° C. and thus any temperature above that will cause the alumina to crack from thermal shock. Therefore, to prevent cracking of the protective wafer CW, the cleaning must be performed after the surface temperature of the mounting stand 13 has been reduced to about 150° C., but this means that it takes time before the cleaning can start.

When the cleaning has ended, fluorine from within the cleaning gas is still dispersed within the vacuum vessel in a radical state, or it has adhered to the inner walls thereof. Thus, if the film-formation processing is performed immediately after this cleaning, the fluorine will be incorporated into the processing of the first few wafers W, particularly the very first wafer, which will impair the film quality. In such a case, pre-coating is performed after the cleaning in order to form a pre-coating film on the inner walls of the vacuum vessel 10 and thus fix the fluorine to the inner wall surfaces, as described below. This pre-coating is a film-formation processing that acts as a preliminary step. If the main film-formation processing step is to create an $SiO_2$ film or the like, the pre-coating film is formed of $SiO_2$ or SiOF or the like.

To prevent the pre-coating film from forming on the surface of the mounting stand 13, a protective wafer PW for pre-coating, made of a material such as a silicon wafer, is placed on the surface of the mounting stand 13 (see FIG. 7D). After the pre-coating has ended, a wafer W for processing is mounted on the mounting stand 13 and once again the formation of an $SiO_2$ film or the like is performed (see FIG. 7E).

The pre-coating gas used for this pre-coat is the same as the film-formation gas. So an alumina wafer can be used as the protective wafer PW. Therefore an alumina protective wafer PW is used for the pre-coating. The processing is performed while the temperature of the mounting stand 13 is being raised until it is close to the temperature of the film-formation process.

However, since the pre-coating takes only a short time, the temperature of the mounting stand 13 cannot rise to the temperature required for the film-formation during that time, and thus more time elapses before the film-formation processing can start. If an alumina protective wafer PW is used in this manner, it takes time to adjust the temperature before each of the cleaning processing and the film-formation processing can start, which reduces the throughput.

SUMMARY OF THE INVENTION

An object of the present invention is to provide a processing method that enables cleaning while protecting the mounting surface of the mounting stand for the object to be processed, such as the surface of the electrostatic chuck. In addition to the above object, another object of the present invention is to provide a processing method that enables processing at a high throughput.

The present invention therefore provides a processing method for an object to be processed, comprising the steps of: mounting an object to be processed on a mounting stand provided within a film-formation chamber; performing a film-formation process on the object to be processed by supplying a film-formation gas into the film-formation chamber; mounting a protective plate of aluminum nitride of the same size as the object to be processed on the mounting stand; and then introducing a cleaning gas into the film-formation chamber to form a plasma, thereby cleaning the interior of the film-formation chamber.

After this cleaning process, it is possible to perform a further step of introducing a film-formation gas into the film-formation chamber to perform a pre-coating process, while the protective plate is still mounted on the mounting stand.

BRIEF DESCRIPTION OF THE DRAWINGS

FIG. 1 is a vertical sectional view of an embodiment of a processing apparatus for implementing the method of the present invention;

FIG. 2 is an enlarged vertical sectional view of a mounting stand used in the processing apparatus of FIG. 1;

DESCRIPTION OF THE PREFERRED EMBODIMENT

Figure 3:
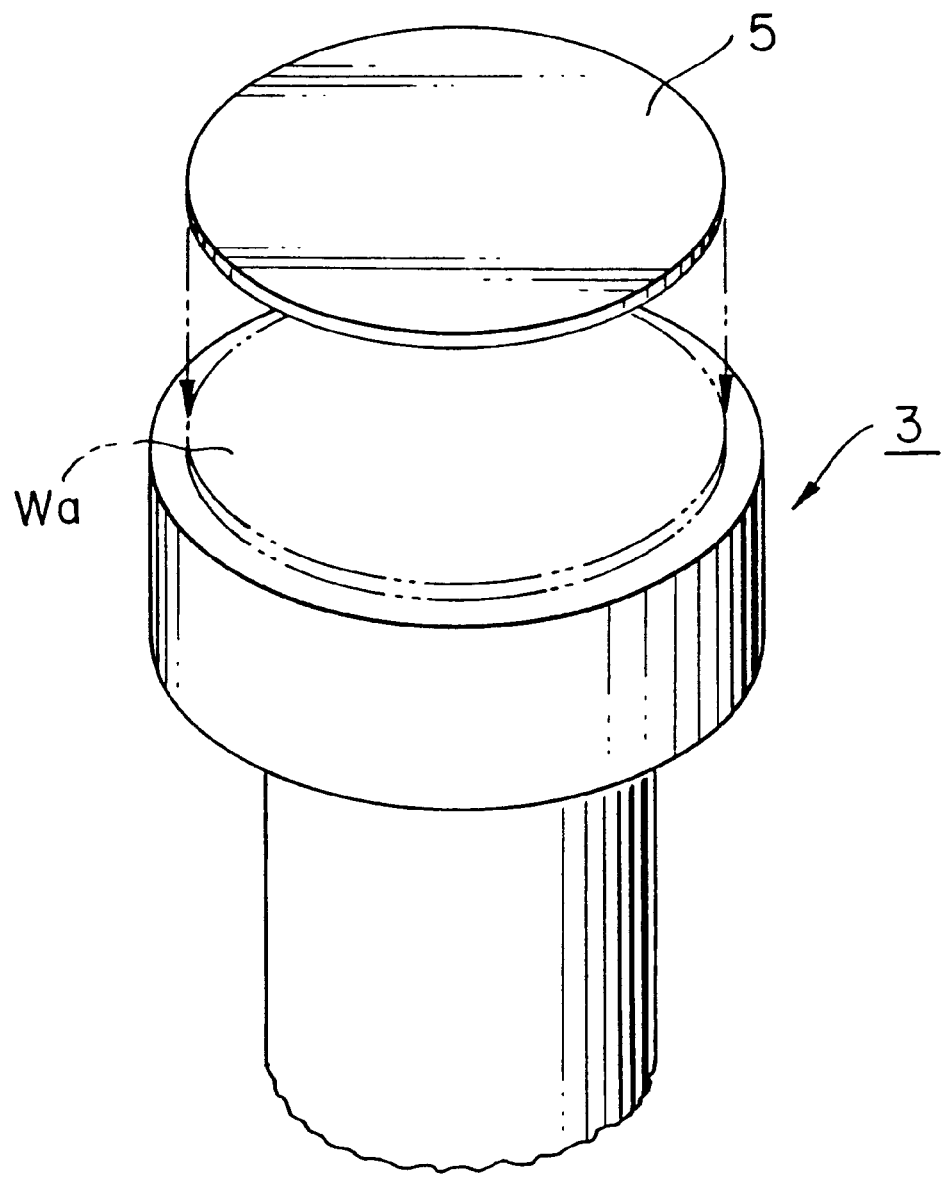
FIG. 3 is a perspective view of the mounting stand and protective plate.

An embodiment of the present invention will be described below. The present invention focuses on the facts that, although aluminum nitride (AlN) is an insulating material, it is attracted by electrostatic forces to a mounting stand that is provided with an electrostatic chuck and, moreover, it is also strong with respect to thermal shocks, and thus this invention can provide a cleaning step that is performed in a state in which a protective plate formed of aluminum nitride has been placed on a mounting surface of a mounting stand.

The processing method of this invention will be described below with reference to an embodiment in which it is applied to ECR plasma processing. A sectional view through an example of an ECR plasma device is shown in FIG. 1 to exemplify the apparatus for implementing the method of this invention. FIG. 2 show on an enlarged, scale the mounting stand for an object to be processed, such as a wafer W.

The description first concerns the overall configuration of the ECR plasma apparatus. This apparatus is configured in such a manner that microwaves M from a high-frequency power source 20 are guided through a waveguide 22 and through a transparent window 23 into a plasma chamber 21 on an upper side of a vacuum vessel 2, a plasma gas such as Ar or $O_2$ is also supplied into the plasma chamber 21 from a plasma gas nozzle 24, and then electronic cyclotron resonance is generated by the application of a magnetic field B from an electromagnetic coil 25 provided outside the plasma chamber 21. The configuration in a film-formation chamber 26 on a lower side of the vacuum vessel 2 is such that a film-formation gas nozzle 27 protrudes thereinto so that a film-formation gas such as $SiH_4$ is supplied through a film-formation gas supply portion 28. In addition, an exhaust pipe 29 is connected to a base portion of the film-formation chamber 26.

A mounting stand 3 for holding a wafer W thereon provided within the film-formation chamber 26 in a freely elevatable manner. This mounting stand 3 is configured of, for example, a main mounting stand unit 31 with a dielectric plate 32 thereupon. The thus configured mounting stand 3 is supported on an upper portion of a circular cylindrical support member 33, where this support member 33 is disposed in such a manner that it passes through a base wall T of the vacuum vessel 2 and it can be raised and lowered while a hermetic seal is maintained with respect to the vacuum vessel 2.

The mounting stand 3 will now be described in detail with reference to FIG. 2. The main mounting stand unit 31 is made of a material such as aluminum and a coolant passageway 34 for circulating a coolant is provided in the interior thereof. The dielectric plate 32 is made of a material such as aluminum nitride (AlN), a pair of electrodes 41 and 42 and a heater 43 that acts as a heating means are embedded therein, and the configuration is such that an outer surface portion (mounting surface portion) of the dielectric plate 32 acts as an electrostatic chuck.

The electrodes 41 and 42 are made of a material such as tungsten foil. They are connected to a DC source 46 for the electrostatic chuck by a switch 45 in a power supply line 44 and also to a high-frequency power source 47 in such a manner that a bias voltage for attracting ions to the wafer W is applied thereto. The heater 43 is formed of a tungsten electrode, for example, and this heater 43 is also connected to a DC power supply source 49 by a power supply line 48. Note that the power supply lines 44 and 48 are each inserted through cylindrical sheaths 44a and 48a.

In this embodiment, a cleaning process and a pre-coating process, which will be described later, are performed after the object W to be processed has been subjected to film-formation processing using the apparatus of FIG. 1 and a protective plate 5 (FIG. 3) is provided for use during these processes. This protective plate 5 is formed to be the same size (or substantially the same size) as the wafer W that is the object to be processed, as shown by way of example in FIG. 3, and is made of a ceramic that is susceptible to electrostatic attraction, such as aluminum nitride. The thickness of the protective plate 5 is not particularly limited, but it could be set to be 0.6 mm by way of example.

Figure 4A:
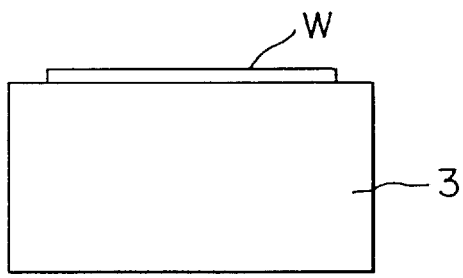
FIGS. 4A to 4D show in sequence an example of steps of the processing method in accordance with the present invention.

The sequence of processing steps performed in the above described ECR plasma apparatus will now be described with reference to FIGS. 4A to 4D. First of all, a processing step for forming a film such as one of SiOF is performed on the wafer W, as shown in FIG. 4A. During this step, a wafer W is transferred onto the mounting stand 3 which is the transfer position for the wafer W from a known load-lock chamber (not shown in the figure) by a known conveyor arm (also not shown in the figure) and by the cooperative action of a known lift pin (also not shown in the figure), and the wafer W is electrostatically attracted to the mounting surface thereof. At this point, the surface of the mounting stand 3 has been heated previously to a temperature of 200° C. by the combination of the coolant in the coolant passageway 34 and the heater (see FIG. 2).

The mounting stand 3 is then raised by the support member 33 (see FIG. 1) to a processing position, and also predetermined quantities of each of the plasma gases such as Ar or $O_2$ from the plasma gas nozzle 24 and the film-formation gas such as $SiH_4$, $O_2$, or $SiF_4$ from the film-formation gas nozzle 27 are supplied, while the interior of the vacuum vessel 2 is maintained at a predetermined degree of vacuum by the exhaust pipe 29.

Microwaves M at 2.45 GHz are introduced into the plasma chamber 21 from the high-frequency power source 20, a magnetic field B of 875 Gauss is applied by the electromagnetic coil 25, and a plasma is formed from the plasma gas by electronic cyclotron resonance generated by the mutual interactions of the microwaves M and the magnetic field B. This plasma gas flows into the film-formation chamber 26 as a plasma flow, activated seeds are created by the action of the plasma on the film-formation gas, and these activated seeds are conveyed onto the wafer W to form an SiOF film.

Figure 4B:
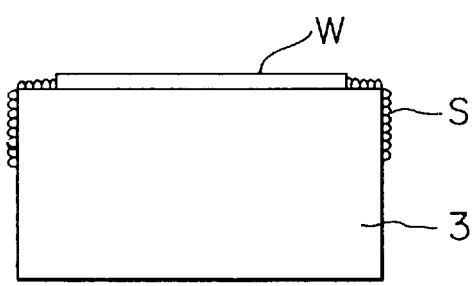
Figure 4C:
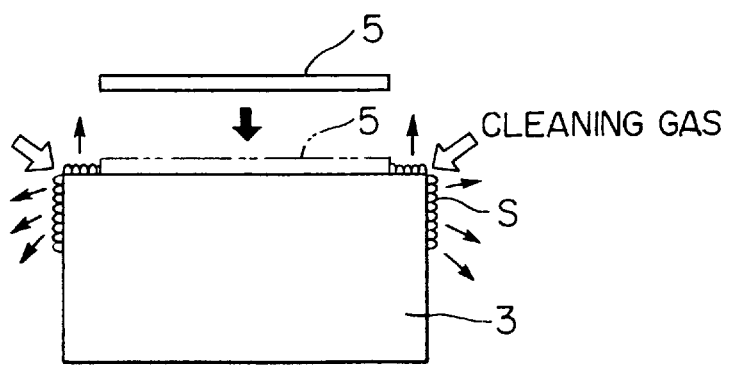
Figure 4D:
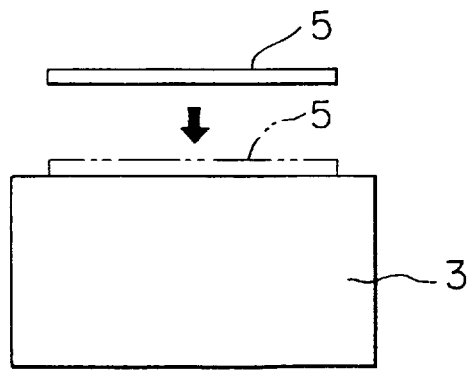

When the SiOF film is formed in this manner, an SiOF film S also adheres to other locations where the film-formation gas has reached, such as the periphery of the wafer W on the mounting stand 3, the outer peripheral portions of the mounting stand 3 within the film-formation chamber 26, and the inner walls of the film-formation chamber 26, as shown in FIG. 4B. In this case, the cleaning step shown in FIGS. 4C and 4D is performed to remove the adhered SiOF film S after the formation of SiOF films on ten wafers W, for example.

In this cleaning step, the protective plate 5 is placed on the mounting stand 3 over a mounting region Wa for the wafer W (see FIG. 3) and it is electrostatically attracted thereto, in the same manner as described above for the wafer W. During this time, a voltage of 1 KV is applied to the electrodes 41 and 42. The mounting stand 3 is then raised to the processing position, the plasma gas such as $O_2$ and a cleaning gas such as $CF_4$ are introduced from the plasma gas nozzle 24 and/or the film-formation gas nozzle 27, in a state in which the interior of the vacuum vessel 2 is maintained at a predetermined degree of vacuum by the exhaust pipe 29. Note that $NF_3$ could also be used as this cleaning gas. In this case, the temperature of the mounting surface of the mounting stand 3 is maintained at the same 200° C. as the temperature during the processing, including the time when the protective plate 5 is being transferred.

Electronic cyclotron resonance is then created within the plasma chamber 21 by the mutual interaction of the microwaves M and the magnetic field B, as described previously, and this causes the plasma gas to form a plasma. The cleaning gas is also turned into a plasma by this plasma gas, to generate radicals. These radicals react with the SiOF film s adhering to the mounting stand 3, this reaction causes the SiOF film S to decompose into components such as $SiF_4$ and disperse therefrom, and thus the SiOF film S is removed out of the vacuum vessel 2 through the exhaust pipe 29 (see FIG. 4D).

Since the protective plate 5 is formed to be the same size as the wafer W and it covers the mounting region Wa for the wafer W on the mounting stand 3, the region where the SiOF film does not adhere because it is covered by the wafer W during the film-formation processing is protected from the plasma by this protective plate 5, the regions where the SiOF film S has adhered are exposed to the plasma, and thus the adhering SiOF film S is removed.

A pre-coating step is then performed. The pre-coating step is film-formation processing that is equivalent to a preliminary step for the film-formation processing performed on the wafer W. It is performed immediately after the cleaning step by introducing a pre-coating gas instead of the cleaning gas while the protective plate 5 is still mounted on the mounting stand 3.

This pre-coating step forms a pre-coating film on the inner walls of the vacuum vessel 2 with the objective of ensuring that fluorine that is within any cleaning gas remaining within the vacuum vessel 2 is sealed into the inner walls of the vessel by the pre-coating film, and thus it is not dispersed within the atmosphere therein. To that end, a process that is similar to the process of forming a film on the wafer W is performed, but there are no rigorous conditions concerning details such as gas volume, pressure, and temperature. As an example of these processing conditions, a plasma gas such as Ar or $O_2$ is introduced from the plasma gas nozzle 24 and a pre-coating gas such as $SiH_4$ is introduced from the film-formation gas nozzle 27, while the temperature of the surface of the mounting stand 3 is maintained at 200° C. and the interior of the vacuum vessel 2 is maintained at a predetermined degree of vacuum by the exhaust pipe 29.

Electronic cyclotron resonance is then created within the plasma chamber 21 by the mutual interaction of the microwaves M and the magnetic field B, and this causes the plasma gas to form a plasma. The pre-coating gas is also turned into a plasma by this plasma gas, to generate radicals that cause the formation of a pre-coating film that is an SiOF film on the inner walls of the vacuum vessel 2 (see FIG. 4D).

As described previously, since the cleaning step of this embodiment is performed in a state in which the protective plate 5 is mounted on the mounting stand 3, the surface of the electrostatic chuck that is the mounting surface of the mounting stand 3 can be protected from the plasma during this step. This suppresses changes in the mounting surface of the mounting stand 3 that is exposed to the plasma, as well as local changes in the attractive force with respect to the wafer W within the mounting surface. Since the attractive force on the wafer W would be greatly affected by heat transfer in this case, suppression of changes in attractive force with respect to the wafer W within the mounting surface makes it possible for heat conduction to be made uniform within that surface. In addition, the protective plate 5 is made of aluminum nitride which is a ceramic, so there is substantially no damage to the plate itself and thus it has a long lifetime.

In this embodiment, the pre-coating step is performed after the cleaning step so that fluorine F within any cleaning gas residing within the vacuum vessel 2 can be sealed into the inner walls of the vacuum vessel 2 by the pre-coating film. Since this means that there is no fluorine dispersed within the vacuum vessel 2 during the subsequent film-formation processing, the incorporation of fluorine that would impair film quality can be suppressed. In addition, since the pre-coating step is performed with the protective plate 5 still mounted on the mounting stand 3, the pre-coating film can be prevented from forming in the mounting region on the mounting stand 3.

Furthermore, the protective plate 5 is made from aluminum nitride so that it is strong with respect to thermal shock and it can thus be placed upon the mounting stand 3 that has a surface temperature of approximately 200° C. In other words, no cracking occurs in the protective plate 5 even when it is placed on the mounting stand 3 at substantially the same temperature as that during the film-formation processing, so that there is no necessity to lower the temperature of the mounting stand 3 in the cleaning step and thus it is possible to perform the cleaning step at the same temperature as that during the film-formation processing.

To discuss this point in more detail: the protective plate 5 is placed on the dielectric plate 32 of the mounting stand 3, but both of the adjoining surfaces of the protective plate 5 and the dielectric plate 32 are not completely flat, so there are minute irregularities thereon that form gaps. Since the film-formation chamber 26 in this case is held in a vacuum, and thus the gaps between these adjoining surfaces are also in a vacuum, there is no heat conduction in these gaps. Therefore, if there are a lot of gaps, there will be little heat conduction between the protective plate 5 and the dielectric plate 32 of the mounting stand 3.

However, if the temperature of the mounting stand 3 during the cleaning and pre-coating steps is the same as the temperature during the process of forming a film on the wafer W, the protective plate 5 will be exposed to the plasma and thus the temperature thereof will rise to approximately 400° C. If the heat conduction between the protective plate 5 and the mounting stand 3 is bad at this time, heat will remain in the protective plate 5 and, as a result, the temperature difference between the two surfaces of the protective plate 5 will increase, subjecting the protective plate 5 to thermal shock which will cause cracking.

In contrast thereto, if the protective plate 5 is attracted and held onto the mounting stand 3, the gaps formed between the adjoining surfaces are considerably smaller in comparison with the situation in which the protective plate 5 is simply placed upon the mounting stand 3, so that the heat conductivity between the protective plate 5 and the dielectric plate 32 increases. Thus, even if heat is applied to the protective plate 5 during the cleaning and pre-coating steps, that heat rapidly escapes towards the mounting stand 3, and so no heat is retained in the protective plate 5 and therefore cracking of the protective plate 5 can be prevented.

Figure 5:
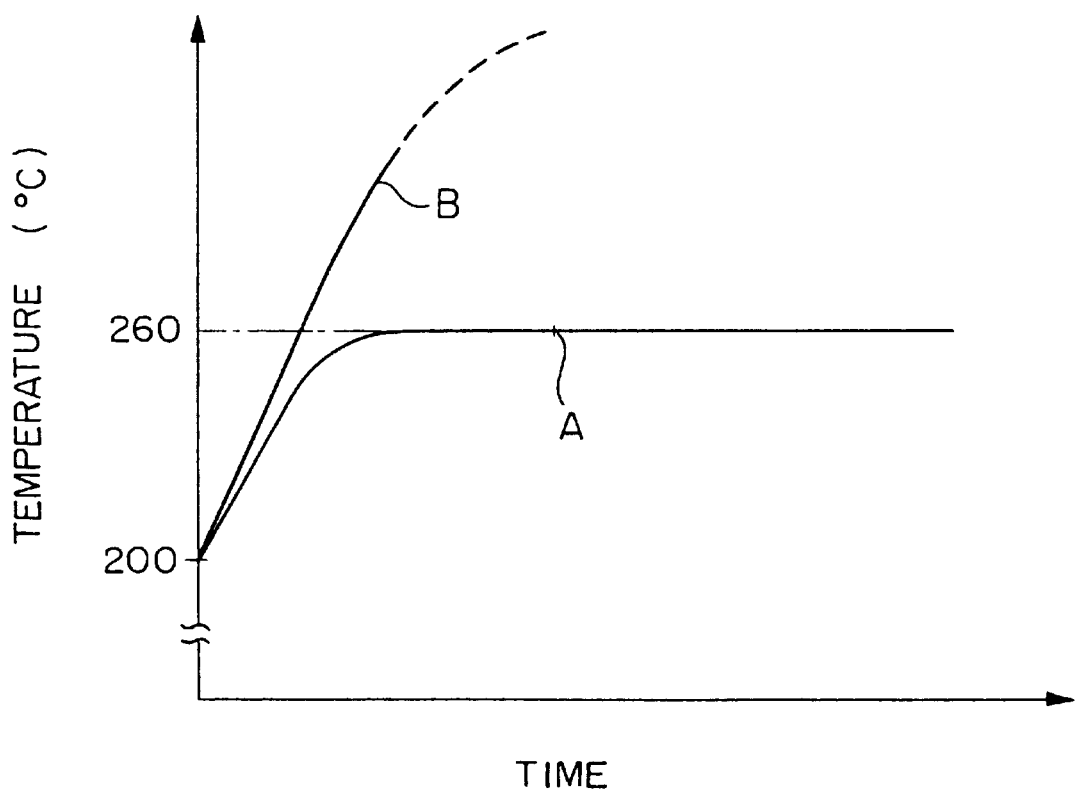
FIG. 5 is a graph of detected temperature of the protective plate.
Figure 6:
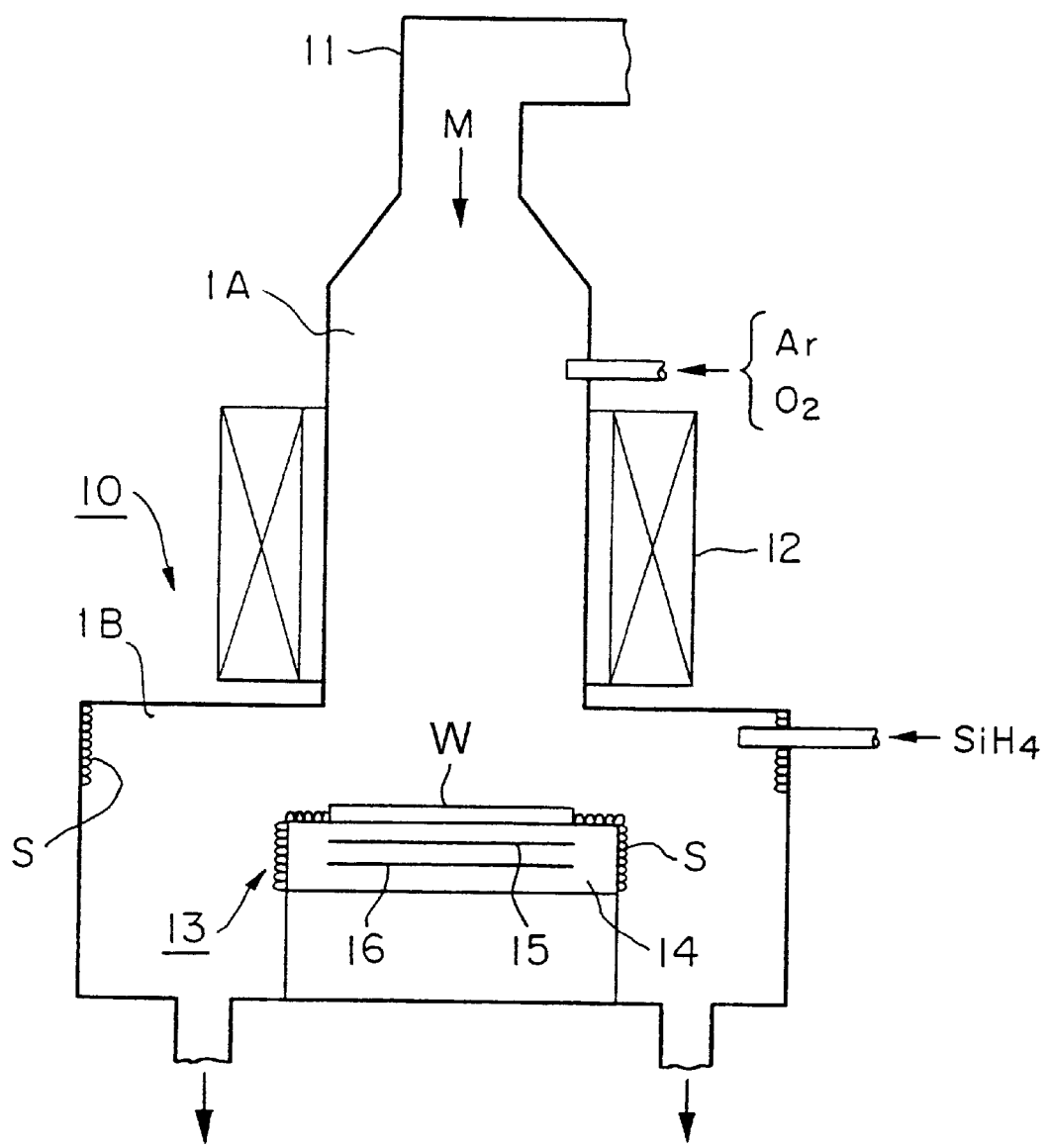
FIG. 6 is a sectional view through a prior-art processing apparatus.
Figure 7A:
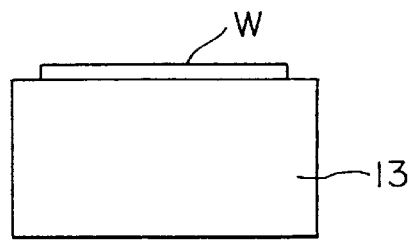
FIGS. 7A to 7E show steps in the sequence of the prior-art method.
Figure 7B:
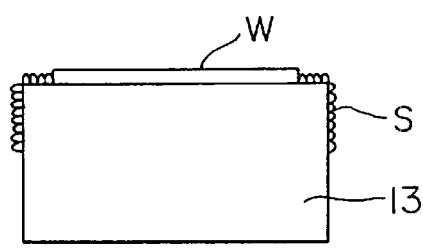
Figure 7C:
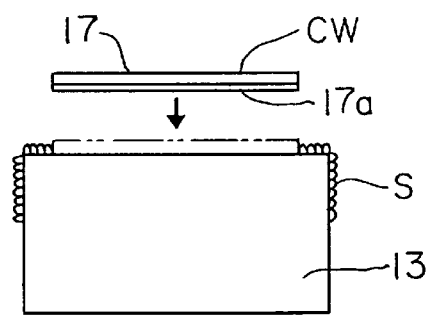
Figure 7D:
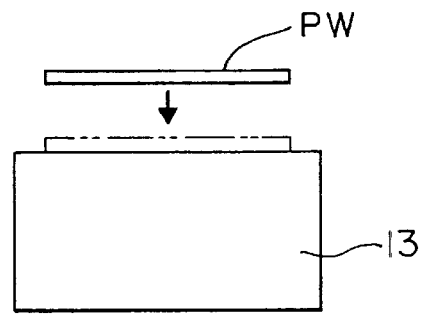
Figure 7E:
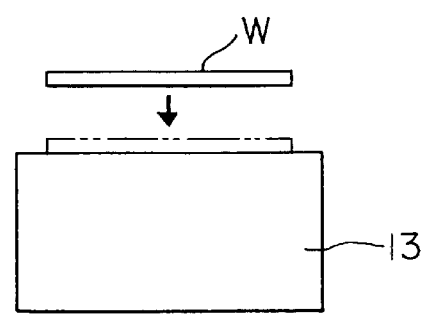

The temperature of the protective plate 5 during the cleaning and pre-coating steps under the above conditions was measured in order to verify the difference in temperature of the protective plate 5 with respect to whether or not electrostatic attraction was activated, with the results being as shown in FIG. 5. In this figure, a curve A shows measurements taken when the protective plate 5 was attracted electrostatically to the surface of the mounting stand 3 (by a voltage of 1 kV applied to the electrodes 41 and 42) and a curve B shows measurements taken when the protective plate 5 was simply placed upon the mounting stand 3. From these results, it was determined that the temperature of the protective plate 5 rose sharply when the protective plate 5 was simply placed upon the mounting stand 3, but in contrast the temperature of the protective plate 5 rose gradually at first when the protective plate 5 was electrostatically attracted to the surface of the mounting stand 3, but this rise stopped at approximately 260° C. and thereafter stabilized. This shows that heat is conducted from the protective plate 5 towards the mounting stand 3.

The above described method is particularly effective for implementing film-formation processing at a high temperature. In other words, if the protective plate is made of a material that is weaker with respect to thermal shock than aluminum nitride, such as glass or alumina, the cleaning has to be performed at a low temperature. Then it is necessary to temporarily reduce the temperature of the mounting stand during the cleaning to about 150° C. and then return it to the original 200° C. for the film-formation processing, when this film-formation processing is at a high temperature such that the surface temperature of the mounting stand 3 reaches approximately 200° C. during the processing. This means that time is wasted until the cleaning starts and the film-formation processing starts, which reduces the throughput. In contrast thereto, if a protective plate 5 of aluminum nitride, which is strong with respect to thermal shocks, is used for high-temperature processing, the cleaning and film-formation processing can be performed at the same temperature, which is effective for enabling an improvement in throughput.

This embodiment also uses the protective plate 5 in both of the cleaning step and the pre-coating step, so the protective plate 5 need only be conveyed in and out once, which enables a further improvement in throughput in comparison with the case in which the protective plate 5 has to be exchanged. The protective plate 5 is also made of aluminum nitride and, thus, it can be attracted and held to the surface of the mounting stand 3 by electrostatic forces, which simplifies the construction because there is no necessity to form an aluminum layer thereon to obtain this attractive force, as there is in the prior-art protective plate 5.

The present invention makes it possible to perform cleaning while protecting the surface of the mounting stand on which the object to be processed is mounted. In addition to this effect, the present invention also makes it possible to perform processing with a high level of throughput.

What is claimed is:

1. A processing method for an object to be processed comprising the steps of:

mounting an object to be processed on a mounting stand provided within a film-formation chamber;

performing a film-formation process on said object to be processed by supplying a film-formation gas containing at least fluorine into said film-formation chamber;

mounting a protective plate of aluminum nitride in place of said object on said mounting stand, said protective plate being of a same size as said object;

introducing a cleaning gas including $CF_4$ into said film-formation chamber to form a plasma, thereby cleaning the interior of said film-formation chamber; and performing a plasma pre-coating step after said step of introducing a cleaning gas by introducing a pre-coating gas that does not contain fluorine into said film-formation chamber while said protective plate is still mounted on said mounting stand to thereby form on inner walls of the film formation chamber, a pre-coating film into which fluorine included in said cleaning gas and remaining within the film formation chamber is sealed.

2. The processing method for an object to be processed as defined in claim 1, further comprising the step of:

introducing a film-formation gas into said film-formation chamber to perform a pre-coating process, while said protective plate is still mounted on said mounting stand.

3. A processing method for an object to be processed comprising the steps of:

mounting an object to be processed on a mounting stand provided within a film-formation chamber;

performing a film-formation process on said object to be processed by supplying a film-formation gas containing at least fluorine into said film-formation chamber;

mounting a protective plate of aluminum nitride in place of said object on said mounting stand, said protective plate being of a same size as said object;

introducing a cleaning gas including $NF_3$ into said film-formation chamber to form a plasma, thereby cleaning the interior of said film-formation chamber; and performing a plasma pre-coating step after said step of introducing a cleaning gas by introducing a pre-coating gas that does not contain fluorine into said film-formation chamber while said protective plate is still mounted on said mounting stand to thereby form on inner walls of the film formation chamber, a pre-coating film into which fluorine included in said cleaning gas and remaining within the film-formation chamber is sealed.

4. The processing method for an object to be processed as defined in claim 3, further comprising the step of:

introducing a film-formation gas into said film-formation chamber to perform a pre-coating process, while said protective plate is still electrostatically attracted to said mounting stand.

5. The processing method for an object to be processed as defined in claim 3, wherein:

said film-formation step is performed while said object to be processed is being heated.

6. The processing method for an object to be processed as defined in claim 5, wherein:

a mounting surface of said mounting stand is heated by said heating means to a temperature of at least 200° C. during said film-formation step.

7. The processing method for an object to be processed as defined in claim 5, wherein:

a mounting surface of said mounting stand is heated by said heating means to a temperature of at least 200° C. during said film-formation step; and said mounting surface of said mounting stand is heated by said heating means to a temperature of at least 200° C. during said cleaning step.

8. A processing method for an object to be processed comprising the steps of:

mounting an object to be processed on a mounting stand provided within a film-formation chamber and being equipped with an electrostatic chuck and heating means;

attracting said object to said mounting stand by means of said electrostatic chuck and supplying a film-formation gas into said film-formation chamber to perform a film-formation process on said object to be processed;

in place of said object, electrostatically attracting to said mounting stand a protective plate of a same size as said object, said protective plate being made of aluminum nitride capable of being attracted electrostatically to said mounting stand;

introducing a cleaning gas including $CF_4$ into said film-formation chamber to form a plasma, thereby cleaning the interior of said film-formation chamber; and performing a plasma pre-coating step after said step of introducing a cleaning gas by introducing a pre-coating gas that does not contain fluorine into said film-formation chamber while said protective plate is still electrostatically attracted to said mounting stand to thereby form on inner walls of the film-formation chamber, a pre-coating film into which fluorine included in said cleaning gas and remaining within the film-formation chamber is sealed.

9. A processing method for an object to be processed comprising the steps of:

mounting an object to be processed on a mounting stand provided within a film-formation chamber and being equipped with an electrostatic chuck and heating means;

attracting said object to said mounting stand by means of said electrostatic chuck and supplying a film-formation gas into said film-formation chamber to perform a film-formation process on said object to be processed;

in place of said object, electrostatically attracting to said mounting stand a protective plate of a same size as said object, said protective plate being made of aluminum nitride capable of being attracted electrostatically to said mounting stand;

introducing a cleaning gas including $NF_3$ into said film-formation chamber to form a plasma, thereby cleaning the interior of said film-formation chamber; and performing a plasma pre-coating step after said step of introducing a cleaning gas by introducing a pre-coating gas that does not contain fluorine into said film-formation chamber while said protective plate is still electrostatically attracted to said mounting stand to thereby form on inner walls of the film formation chamber, a pre-coating film into which fluorine included in said cleaning gas and remaining within the film formation chamber is sealed.

10. The processing method for an object to be processed according to claim 3, further comprising the step of:

introducing a film-formation gas into said film-formation chamber to perform a pre-coating process, while said protective plate is still mounted on said mounting stand.

11. The processing method for an object to be processed according to claim 9, further comprising the step of:

introducing a film-formation gas into said film-formation chamber to perform a pre-coating process, while said protective plate is still electrostatically attracted to said mounting stand.

12. The processing method for an object to be processed according to claim 9, wherein:

said film-formation step is performed while said object to be processed is being heated.

13. The processing method for an object to be processed according to claim 12, wherein:

a mounting surface of said mounting stand is heated by said heating means to a temperature of at least 200° C. during said film-formation step.

14. The processing method for an object to be processed according to claim 12, wherein:

a mounting surface of said mounting stand is heated by said heating means to a temperature of at least 200° C. during said film-formation step; and said mounting surface of said mounting stand is heated by said heating means to a temperature of at least 200° C. during said cleaning step.

15. A processing method for an object to be processed, comprising the steps of:

mounting an object to be processed on a mounting stand provided within a film-formation chamber;

performing a film-formation process on said object to be processed by supplying a film-formation gas containing at least fluorine into said film-formation chamber to form a deposited film on said object;

mounting a protective plate of aluminum nitride in place of said object on said mounting stand, said protective plate being of a same size as said object;

introducing a cleaning gas including fluorine into said film-formation chamber to form a plasma, thereby cleaning the interior of said film-formation chamber;

after said step of introducing a cleaning gas, introducing a pre-coating gas that does not contain fluorine into said film-formation chamber while said protective plate is still mounted on said mounting stand, to perform a plasma pre-coating step, thereby forming a pre-coating film on inner walls of the film-formation chamber; and sealing fluorine included in said cleaning gas and remaining within the film-formation chamber, into said pre-coating film.

16. The processing method according to claim 15, wherein said film-formation gas containing at least fluorine comprises $SiH_4$, and said deposited film is a SiOF film.

17. The processing method according to claim 16, wherein said pre-coating film is a SiOF film and said cleaning gas includes $CF_4$.

18. The processing method according to claim 15, wherein said pre-coating film is a SiOF fan said cleaning gas includes $NF_3$.

* * * * *